(12) United States Patent
Lee

(10) Patent No.: US 6,604,395 B2
(45) Date of Patent: Aug. 12, 2003

(54) SEMI-AUTOMATED PROBE BENDER

(75) Inventor: Chong Meng Lee, Singapore (SG)

(73) Assignee: St Assembly Test Services Ltd., Singapore (SG)

( * ) Notice: Subject to any disclaimer, the term of this patent is extended or adjusted under 35 U.S.C. 154(b) by 0 days.

(21) Appl. No.: 09/910,157

(22) Filed: Jul. 23, 2001

(65) Prior Publication Data
US 2003/0015013 A1 Jan. 23, 2003

(51) Int. Cl.⁷ .............................. B21C 51/00; B21D 7/14
(52) U.S. Cl. ................... 72/37; 72/316; 72/319; 72/387
(58) Field of Search ................ 72/319, 316, 307, 72/387, 386, 37

(56) References Cited
U.S. PATENT DOCUMENTS

| | | | | |
|---|---|---|---|---|
| 940,360 A | * | 11/1909 | Richards | 72/319 |
| 2,228,448 A | * | 1/1941 | Fader | 72/319 |
| 3,447,355 A | * | 6/1969 | Villa | 72/319 |
| 3,584,660 A | * | 6/1971 | Paine et al. | 72/307 |
| 3,901,064 A | * | 8/1975 | Jacobson | 72/319 |
| 4,489,652 A | * | 12/1984 | Takeuchi et al. | 101/181 |
| 4,510,686 A | | 4/1985 | Foster | 29/838 |
| 4,627,255 A | * | 12/1986 | Archer et al. | 72/17.3 |
| 4,773,284 A | * | 9/1988 | Archer et al. | 72/21.6 |
| 4,813,255 A | * | 3/1989 | Birk et al. | 72/14.4 |
| 4,892,122 A | * | 1/1990 | Ickes | 140/123 |
| 5,375,447 A | * | 12/1994 | Del Fabro et al. | 72/307 |
| 5,461,893 A | * | 10/1995 | Tyler | 72/10.1 |
| 5,513,430 A | | 5/1996 | Yanof et al. | 29/846 |
| 5,517,126 A | | 5/1996 | Yamaguchi | 324/758 |
| 5,969,533 A | | 10/1999 | Takagi | 324/754 |
| 6,092,565 A | * | 7/2000 | Sautter et al. | 72/131 |

* cited by examiner

Primary Examiner—Daniel C. Crane
(74) Attorney, Agent, or Firm—George O. Saile; Stephen B. Ackerman; Cheryl Figlin

(57) ABSTRACT

A method and apparatus for bending probe pins that is semi-automated and uses machine vision to eliminate human error.

20 Claims, 5 Drawing Sheets

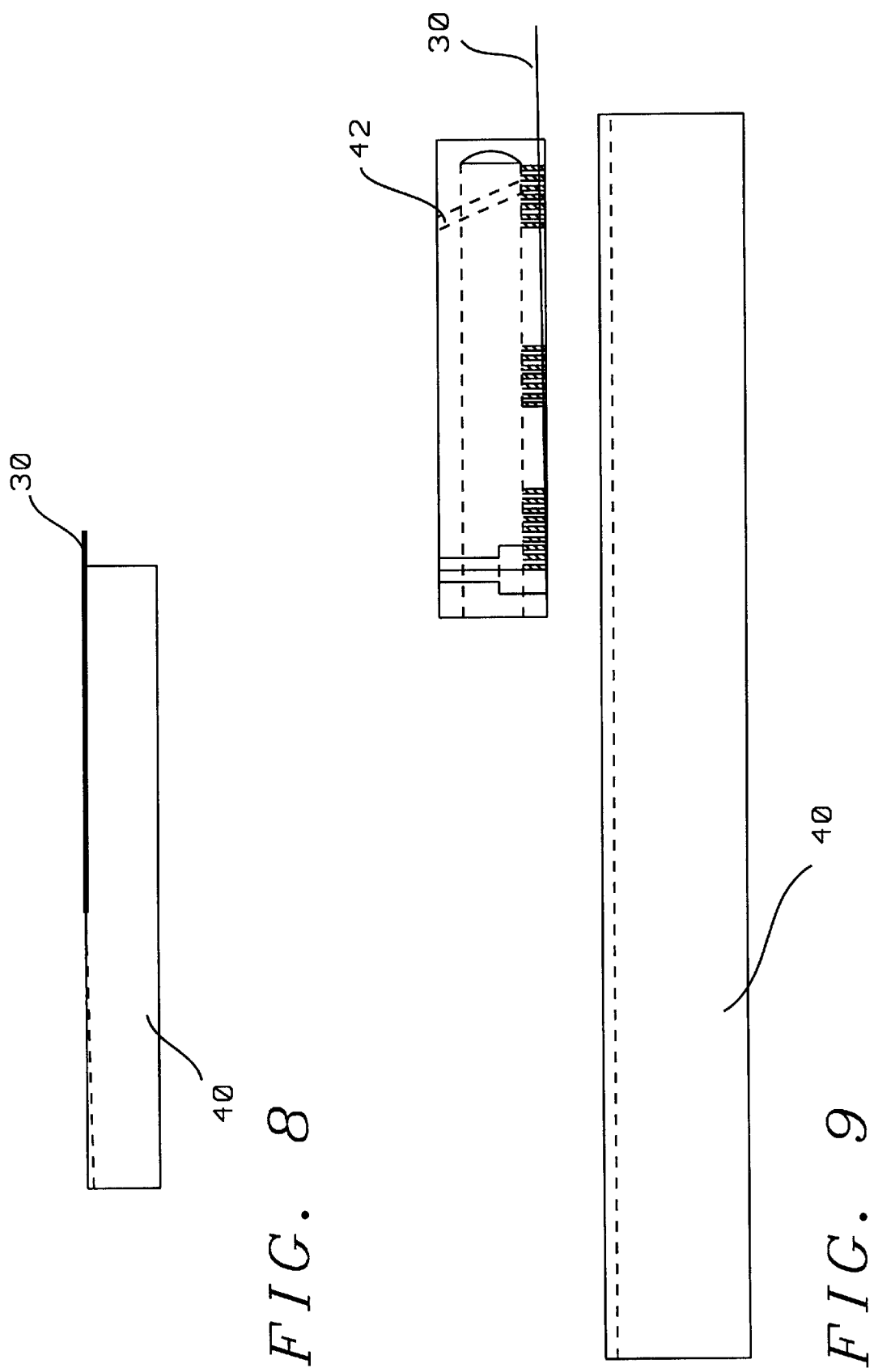

SEMI-AUTOMATED PROBE BENDER

BACKGROUND OF THE INVENTION

1. Field of Invention

The present invention relates generally to an improved method of making probe needles for probe cards. More particularly, the present invention relates to the apparatus used in bending the probe needles for probe cards.

2. Description of Prior Art

Probe needles (or leads) used for probe card assembly are now bended and inspected manually. The probe needles are bent to the desired tip diameter and angle with a tool known as a jig. A trial and error method is used during the setup until the desired parameters are achieved. The inspection for the desired tip length, diameter and angle is done on a shadow comparator. Comparison is done by matching the shadow of the needle to a template.

Workers in the art are aware that this process is slow, tedious, and prone to human error. The human error and manual aspects of this process lead ultimately in not being able to use about 20 percent of probe pins.

Others have striven to solve this problem. For Example U.S. Pat. No. 5,513,430 (Yanof et al.) teaches creating the leads as part of the device and using resist and deposition to form the probe needles at appropriate angle. U.S. Pat. No. 4,892,122 (Ickes) teaches a probe pin alignment tool. U.S. Pat. No. 4,510,686 (Foster) teaches an apparatus for straightening and aligning leads. However this straightening and aligning takes place after the probe needles were bent. U.S. Pat. No. 5,969,533 (Takagi) shows a very general process of a probe card having bent probe tips. Finally, U.S. Pat. No. 5,517,126 (Yamaguchi) teaches a probe apparatus for testing.

SUMMARY OF THE INVENTION

Accordingly, the present invention provides a method for bending the probe needles that is semi-automated and uses machine vision to eliminate human error. Further to improve the output of the probes from approximately 1.5 minutes per probe to approximately 7.5 seconds per probe. Finally the devices that are unusable due to error in probe needles drops from approximately 20 percent to approximately 1 percent.

Another purpose of the present invention is to provide an apparatus for bending a probe pin having a base structure with a guide block attached to the top of the base structure. The structure further comprising a bending fixture for bending of a probe pin such that a probe pin can be placed on the guide block and pushed into place, and then bended by the bending fixture.

BRIEF DESCRIPTION OF THE DRAWINGS

In the accompanying drawings forming a material part of this description there is shown:

FIG. 8 is a simplified cross sectional view of the probe pin on the incoming tray of the invention.

FIG. 9 is a simplified cross sectional view of an optional pick-up finger of the invention.

DETAILED DESCRIPTION OF THE INVENTION

Figure 1:
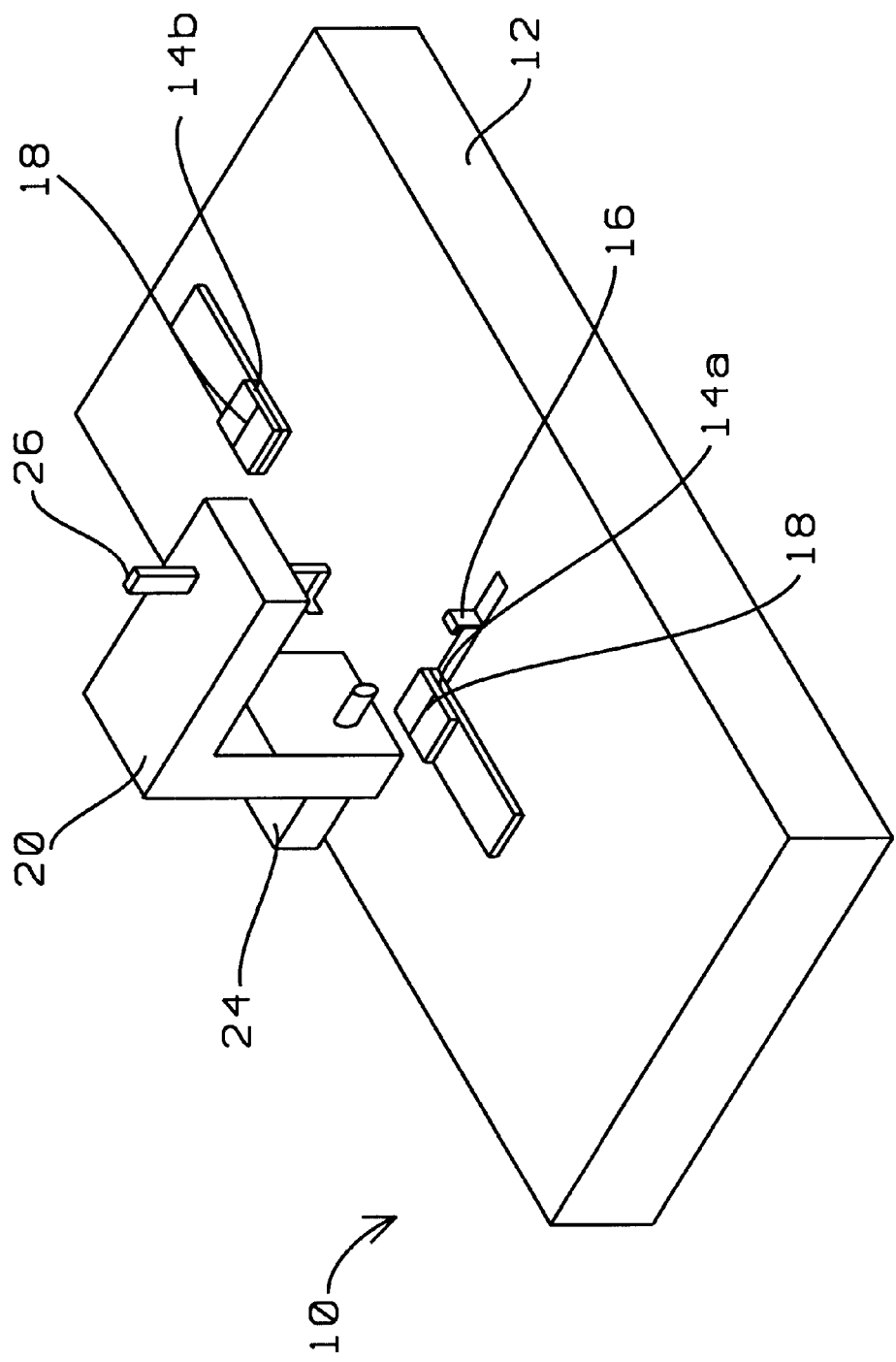
FIG. 1 shows a perspective view of an apparatus of the current invention.

Referring now more particularly to FIG. 1, an apparatus for bending probe pins 10. The apparatus 10 consists of a base 12. The base 12 is preferably made of Aluminum. The base has two guide blocks 14a and 14b. Only one guide block is in use at a time, the operator is loading a second guide block while the other is being used. The guide blocks 14a and 14b have the ability to slide into position for bending and then out of position for bending. The guide blocks are preferably made of Aluminum. Probe pins can be manually placed on guide blocks or optionally the probe pins can be placed on an incoming tray 40 along side the apparatus 10 (see FIG. 8). Optionally, a pick up finger 42 shown in FIG. 9 can suck up the probe pin 30 from the incoming tray 40 and transfer it to the guide block 14a or 14b. Near guide block 14a is a probe pin pusher 16. The probe pusher 16 pushes the probe pin until the vision camera 24, See FIG. 6a, detects a desired length. The probe pin pusher is preferably made of Aluminum.

Figure 2A:
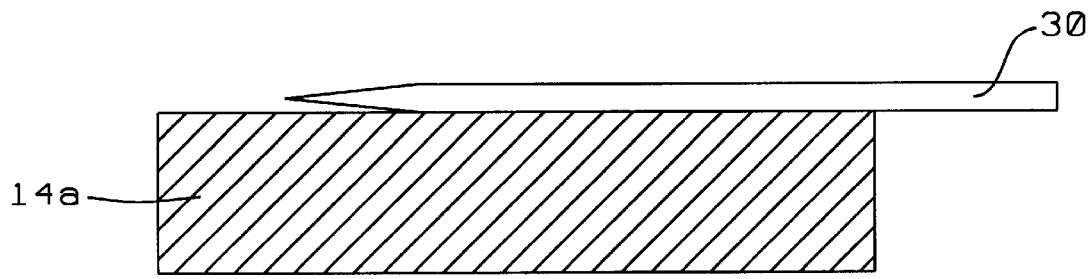
FIG. 2A shows a cross-sectional view of a guide block of the apparatus of the current invention.
Figure 2B:
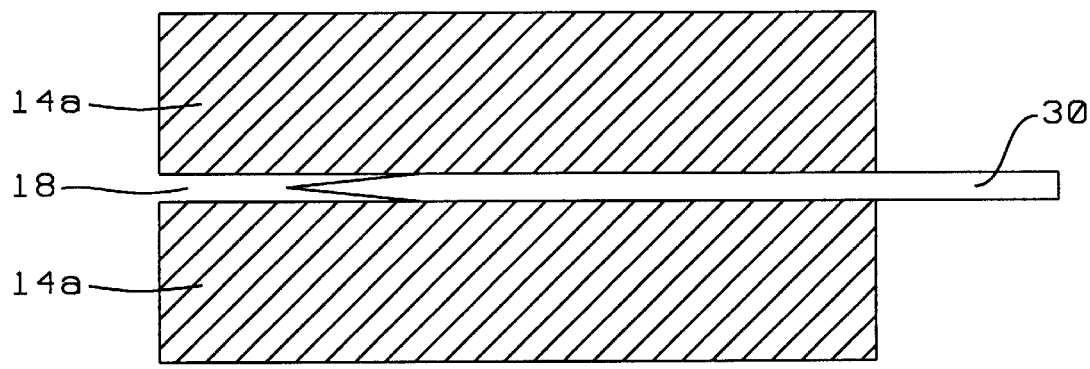
FIG. 2B show a top view of a guide block of the apparatus of the current invention.

As seen in FIGS. 2a and 2b, guide block 14a also has a groove 18 to guide probe. The apparatus further has fixture 20 having a vision camera 24, and a bending fixture 26.

Figure 3:
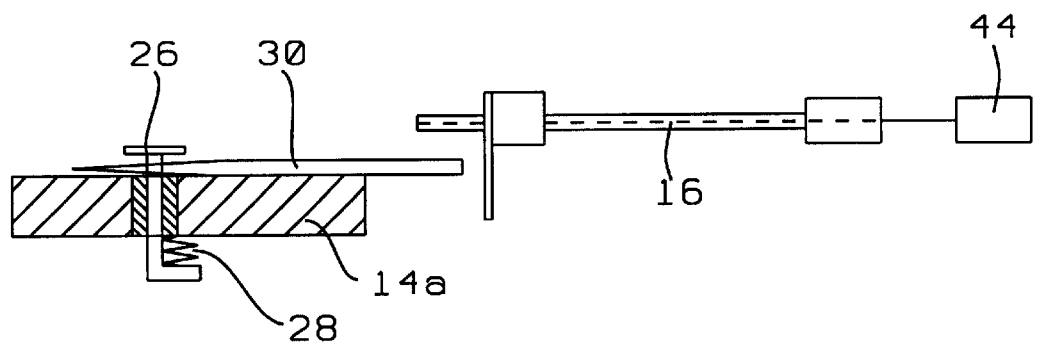
FIG. 3 is a simplified cross-sectional view of a probe pin on the guide block of the apparatus of the current invention.

As shown in FIG. 3 guide block 14a further has a crimp 26 and a spring 28 so that the crimp will hold down a probe pin 30. A stepper motor 44 is connected to a probe pusher 16. The stepper motor will push the probe pusher so that the probe pin is at the proper distance.

Figure 4:
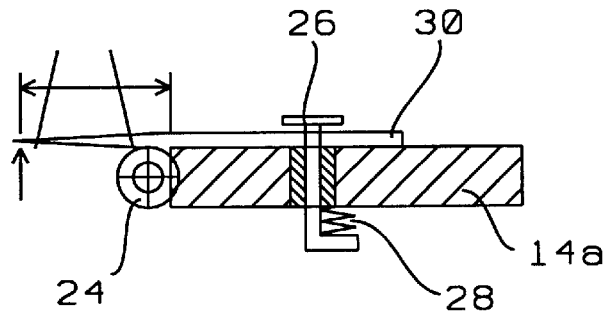
FIG. 4 is a simplified cross-sectional view of a probe pin on the guide block and ready to bend.

In FIG. 4, the probe pin 30 is placed ready for bending. Vision camera 24 will determine length A. The probe pins have a diameter of 10 to 16 mils at the thickest section. The probe pins have a diameter of 6 to 10 mils and the average pin is usually 0.6 to 2 mils and an average of 1 mils at the point of the probe pin. The probe pin length is 0.5 to 3 inches and the average pin is usually 1 inches. The probe pins are usually made of Tungsten or Rhenium Tungsten. Vision camera 24 measures the probe pin to make sure the probe pin placement is correct.

Figure 5:
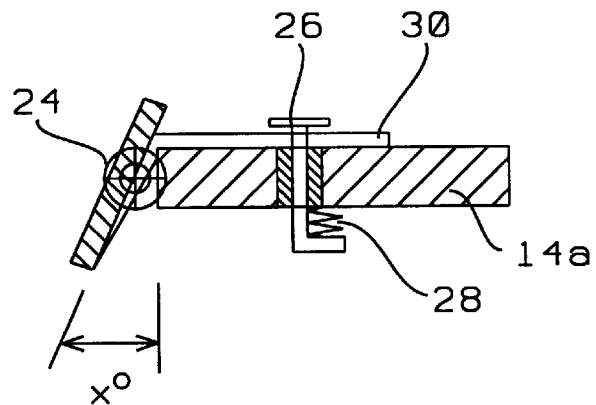
FIG. 5 is a simplified cross-sectional view of a probe pin during bending on the guide block of the apparatus of the current invention.

As shown in FIG. 5 bending fixture 26 comes down to bend probe pin 30, while the crimp 26 holds the probe pin in place and the vision camera checks the bending angle. After the bending of the pin, the pin can be taken off manually or, again the optional pick-up finger 42 can suck up the probe pin 30 and transfer to the loading tray 40.

Figure 6B:
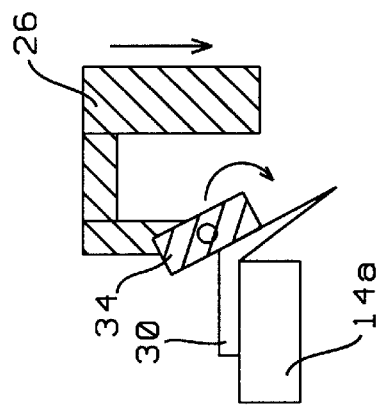
FIGS. 6A–C is another set of simplified cross-sectional views of a probe pin during bending on the guide block of the apparatus of the current invention emphasizing the bending fixture having a pivotal feature.
Figure 6A:
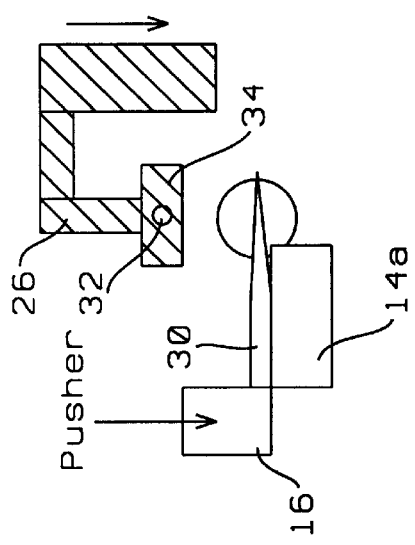
Figure 6C:
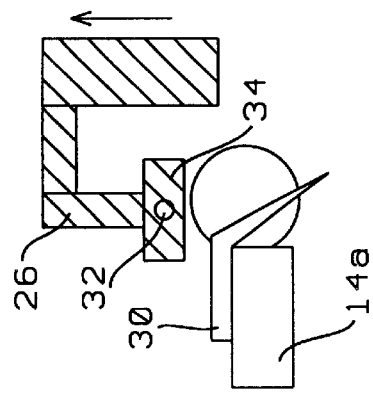

FIG. 6 further illustrates the bending process with a simplified drawing that does not show some of the details of the invention FIG. 6a shows probe pin pusher 16 that has pushed the probe pin till a desired length detected by the vision camera 24. FIG. 6a further illustrates the structure of bending fixture 26. Bending fixture 26 has an adjusting screw 32 and a horizontal portion 34. The horizontal portion 34 of bending fixture 26 pivots as bending fixture 26 lowers to bend the probe pin, see FIG. 6b. FIG. 6c illustrates the vision camera 24 inspecting the angle, and tip length of the probe pin once bent The angle of the bent probe pin is preferably 100 to 110 degrees.

Figure 7:
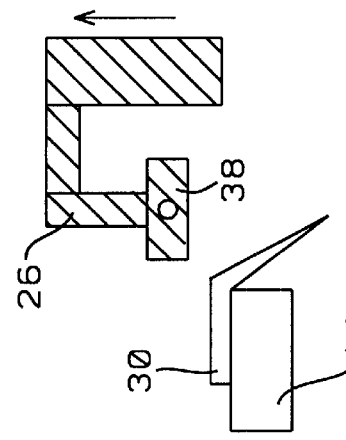
FIG. 7 is a simplified cross sectional view of a second embodiment of the current invention.

FIG. 7 illustrates a second embodiment of the invention. Bending fixture 26 in this embodiment further comprises a pin 36, and a block 38 that lowers toward the probe pin as bending fire 26 lowers to bend the probe pin The block 38 can be made out of metal or a plastic.

While the invention has been particularly shown and described with reference to the preferred embodiments thereof, it will be understood by those skilled in the art that various changes in form, and details may be made without departing from the spirit and scope of the invention.

What is claimed is:

1. An apparatus for bending a probe pin comprising:
   a base structure having a guide block attached to the top of said base structure;
   a fixture also attached to the top of said base structure having a lower vision camera;
   said fixture further comprising a bending fixture being movable between two positions in order to facilitate the bending of a probe pin;
   such that a probe pin can be placed on the guide block and pushed into place, then measured by the vision camera to check on positioning and subsequently bent by the bending fixture.

2. An apparatus for bending a probe pin comprising:
   a base structure having two guide blocks attached to the top of said base structure;
   a fixture also attached to the top of said base structure and located behind and between the two guide blocks;
   said fixture having vertical and horizontal portions with respect to the base structure resulting generally in an upside down L shape;
   said horizontal portion of the fixture having a bending fixture located at a far end of the horizontal portion with respect to the vertical portion;
   said bending fixture being movable between two positions in order to facilitate the bending of a probe pin;
   said vertical portion of the fixture having a vision camera;
   such that a probe pin can be placed on the guide block and pushed into place, then measured by the vision camera to check on positioning and subsequently beat by the bending fixture.

3. The apparatus of claim 2, with the guide block further comprising a groove.

4. The apparatus of claim 2 wherein the guide block further comprises a crimp and spring configuration to hold down said probe pin.

5. The apparatus of claim 2, wherein said bending fixture further comprises:
   a pivotal horizontal portion on the bottom of said bending fixture such that the horizontal portion pivots on an adjusting screw as the bending fixture lowers to bend the probe pin.

6. The apparatus of claim 2, wherein said bending fixture further comprises:
   a block portion on the bottom of said bending fixture such that the block portion bends the probe pin as the bending fixture lowers to bend the probe pin.

7. The apparatus of claim 2, wherein there are two guide blocks that are movable between two positions such that one guide block can be holding a probe pin in the process of bending while a second guide block can be loaded with a probe pin.

8. The apparatus of claim 2, wherein the probe pin is pushed into place by a probe pusher located behind the probe pin.

9. The apparatus of claim 8, wherein a stepper motor controls the probe pusher.

10. The method of bending probe pins comprised of:
    placing a probe pin on a guide block;
    bending the probe pin with a bending fixture;
    measuring the bending angle and distance with a vision camera;
    loading second guide block with a second probe pin while the first guide block is bending said probe pin.

11. The method of claim 10, wherein the second guide block is moved to the bending fixture while the guide block is moved to a position where it can be loaded with a third probe pin.

12. The method of claim 10, wherein the bending fixture comprises:
    a pivotal horizontal portion on the bottom of said bending fixture such that the horizontal portion pivots on an adjusting screw as the bending fixture lowers to bend the probe pin.

13. The method of claim 10, wherein said bending fixture comprises:
    a block portion on the bottom of said bending fixture such that the block portion bends the probe pin as the bending fixture lowers to bend the probe pin.

14. The method of claim 10, wherein the probe pins has a diameter of 6 to 10 mils.

15. The method of claim 10, wherein the probe pin has a point having a diameter of 0.6 to 2 mils.

16. The method of claim 15, wherein the probe pins point has a diameter of 1 mils.

17. The method of claim 10, wherein the probe pin length is 0.5 to 3 inches.

18. The method of claim 17, wherein the probe pin length is 3 inches.

19. The method of claim 10, wherein the probe pin is pushed into place by a probe pusher located behind the probe pin.

20. The method of claim 19, wherein a stepper motor controls the probe pusher.

* * * * *